United States Patent
Wu et al.

(10) Patent No.: US 7,940,553 B2
(45) Date of Patent: May 10, 2011

(54) METHOD OF STORING AN INDICATION OF WHETHER A MEMORY LOCATION IN PHASE CHANGE MEMORY NEEDS PROGRAMMING

(75) Inventors: Patrick Wu, San Jose, CA (US); Richard Fackenthal, Carmichael, CA (US); Ferdinando Bedeschi, Monza (IT); Meenatchi Jagasivamani, Folsom, CA (US); Enzo Michele Donze, San Giuseppe Jato (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 186 days.

(21) Appl. No.: 12/346,459

(22) Filed: Dec. 30, 2008

(65) Prior Publication Data
US 2010/0165714 A1 Jul. 1, 2010

(51) Int. Cl.
*G11C 11/00* (2006.01)
(52) U.S. Cl. .................... 365/163; 365/148; 365/189.05
(58) Field of Classification Search .................. 365/163, 365/148, 189.05, 189.07, 230.08, 238, 189.16, 365/185.18, 185.19
See application file for complete search history.

(56) References Cited

U.S. PATENT DOCUMENTS

| | | | |
|---|---|---|---|
| 7,366,014 B2* | 4/2008 | Micheloni et al. | 365/185.03 |
| 7,583,546 B2* | 9/2009 | Dietrich et al. | 365/189.16 |
| 7,587,593 B2* | 9/2009 | Murakoshi | 713/165 |
| 2008/0316792 A1* | 12/2008 | Philipp | 365/148 |

FOREIGN PATENT DOCUMENTS
WO 2008/027691 A2 3/2008
* cited by examiner

*Primary Examiner* — Dang T Nguyen
(74) *Attorney, Agent, or Firm* — Lisa K. Jorgenson; William J. Pigott; Seed IP Law Group PLLC

(57) ABSTRACT

A phase change memory includes a float buffer which stores the result of a comparison between the current state of data in the phase change memory cells and an intended next state of each of those cells. The float buffer indicates which cells need to be programmed in order to achieve the new states and which cells happen to already be in the new states. Then, after programming of the cells, the float buffer indicates which cells still need to be programmed. Thus, a control stage uses the information in the float buffer to program only those cells whose states need to be changed.

21 Claims, 5 Drawing Sheets

METHOD OF STORING AN INDICATION OF WHETHER A MEMORY LOCATION IN PHASE CHANGE MEMORY NEEDS PROGRAMMING

BACKGROUND

1. Technical Field

The present disclosure relates generally to phase change memory devices and in particular to a method of storing an indication of whether a memory location in phase change memory needs programming.

2. Description of the Related Art

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Unlike traditional flash memories, which are characterized by bulk erase, phase change memories such as Bi-OUMs (wherein each memory cell is formed by an ovonic unified memory element in series with a bipolar junction transistor) feature RAM-like bit manipulation and have a bit-alterable mode. This allows the capability to program both "0" and "1" selectively onto each cell. Thus, a tracking mechanism is used to ensure that the memory cells are programmed correctly after each program algorithm is performed.

BRIEF SUMMARY

One embodiment provides a programming and verifying method that allows efficient tracking of the programmed cells.

One embodiment is method that includes:

determining whether a memory cell in a phase change memory array needs programming by comparing a state of data stored in the memory cell with a desired state; and storing in a storage element a result of the comparing between the state of the data stored in the memory cell and the desired state.

One embodiment is a phase change memory that includes:

an array of phase change memory cells;

a comparator configured to compare a state of a datum stored in a selected one of the memory cells and a desired state, and output a result; and a storage element configured to store the result output by the comparator.

BRIEF DESCRIPTION OF THE SEVERAL VIEWS OF THE DRAWINGS

For the understanding of the present disclosure, a preferred embodiment is now described, purely as a non-limitative example, with reference to the enclosed drawings, wherein.

DETAILED DESCRIPTION

Figure 1:
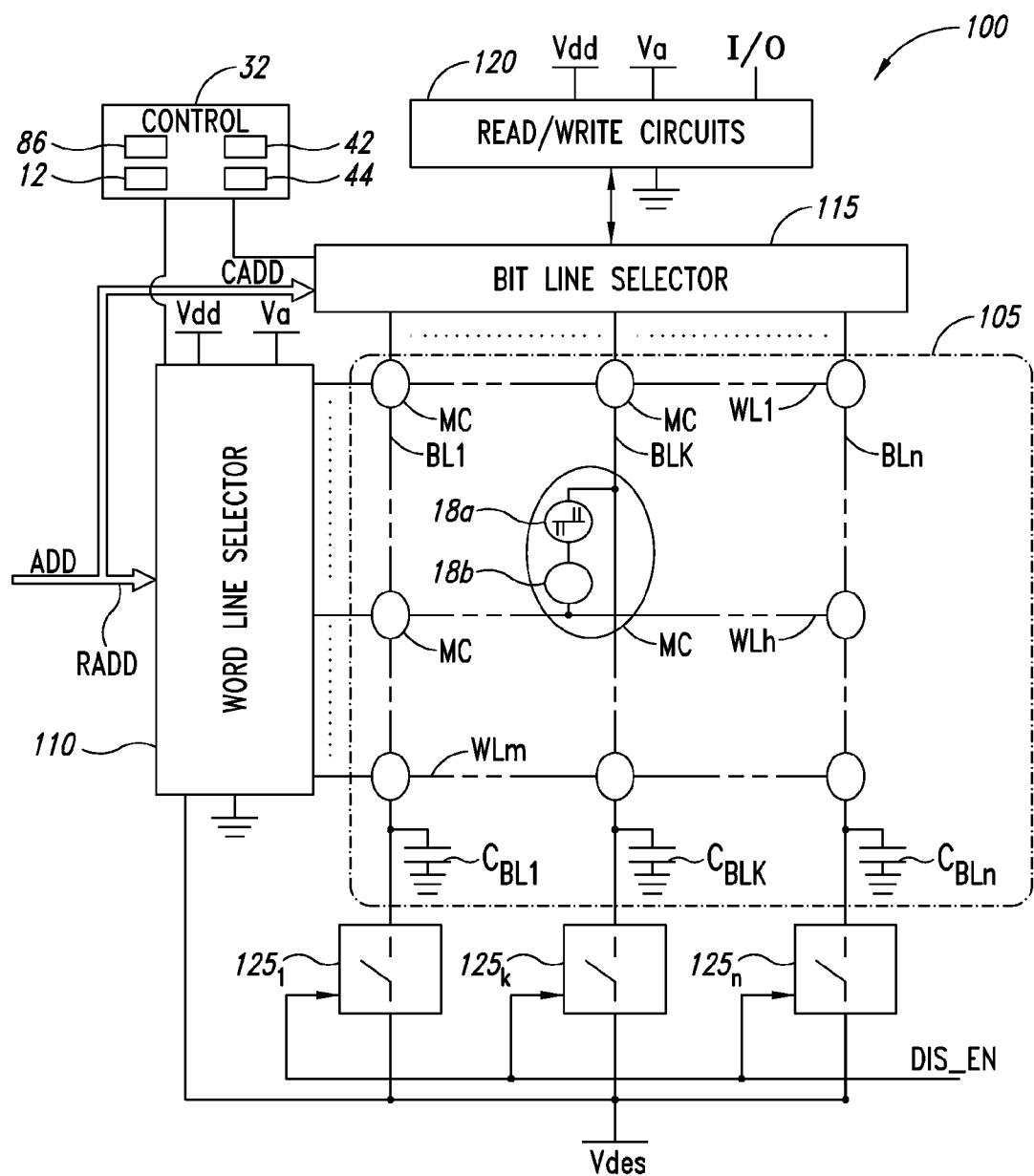
FIG. 1 is a schematic depiction of one embodiment.

FIG. 1 shows a memory 100 including an array 105 of memory cells MC arranged in rows WL and columns BL. While a relatively small array is illustrated, the present invention is in no way limited to any particular size of the array. Also, the memory 100 may use single or multi-level memory cells MC. While the terms "rows", "word lines", "bit lines", and "columns" are used herein, they are merely meant to be illustrative and are not limiting with respect to the type and style of the sensed array.

The memory cells MC in the array 105 are arranged in m rows and n columns with a word line WL1-WLm associated with each array row, and a bit line BL1-BLn associated with each array column.

The memory device 100 includes also a number of auxiliary lines including a supply voltage line Vdd, distributing a supply voltage Vdd through a chip including the memory device 100, and a ground voltage line GND distributing a ground voltage. Supply voltage Vdd, depending on the specific memory device embodiment, may be, typically, from 1 to 3 V, for example 1.8 V. A high voltage supply line Va provides a relatively high voltage, generated by devices (e.g., charge-pump voltage boosters not shown in the drawing) integrated on the same chip, or externally supplied to the memory device 100. For example, the high voltage Va may be 4.5-5 V.

Each cell MC is a phase change memory cell formed by a storage element 18a and an access, select, or threshold device 18b coupled in series to the storage device 18a. The threshold device 18b may be an ovonic threshold switch that is made of a chalcogenide alloy that does not exhibit an amorphous to crystalline phase change and which undergoes a rapid, electric field initiated change in electrical conductivity that persists only so long as a holding voltage is present.

Each memory cell MC in the array 105 is connected to a respective one of the word lines WL1-WLm and a respective one of the bit lines BL1-BLn. In particular, the storage element 18a may have a first terminal connected to the respective bit line BL1-BLn and a second terminal connected to a first terminal of the associated threshold device 18b. The threshold device 18b may have a second terminal connected to a word line WL1-WLm. Alternatively, the storage element 18a may be connected to the respective word line WL1-WLm and the threshold device 18b, associated with the storage element 18a, may be connected to the respective bit line BL1-BLn.

A memory cell MC within the array 105 is accessed by selecting the corresponding row and column pair, i.e., by selecting the corresponding word line and bit line pair. Word line selector circuits 110 and bit line selector circuits 115 perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 decode the row address code RADD and select a corresponding one of the word lines WL1-WLm, identified by the specific row address code RADD received. The bit line selector circuits 115 decode the column address code CADD and select a corresponding bit line or, more generally, a corresponding bit line packet of the bit lines BL1-BLn. For example, the number of selected bit lines depends on the number of data words that can be read during a burst reading operation on the memory device 100. A bit line BL1-BLn is identified by the received specific column address code CADD.

The bit line selector circuits 115 interface with read/write circuits 120. The read/write circuits 120 enable the writing of desired logic values into the selected memory cells MC, and the reading of the logic values currently stored therein. For example, the read/write circuits 120 include sense amplifiers together with comparators, reference current/voltage generators, and current pulse generators for writing and reading the logic values stored in the memory cells MC.

In one embodiment, in a stand-by operating condition, as well as before any read or write access to the memory device 100, the word line selection circuits 110 keep the word lines WL1-WLm at a relatively high deselection voltage Vdes (e.g., a voltage roughly equal to half the high voltage Va (Va/2)). At the same time, the bit line selection circuits 115 keep the bit lines BL1-BLn disconnected, and thus isolated, from the read/write circuits 120 or, alternatively, at the relatively low deselection voltage Vdes. In this way, none of the memory cells MC is accessed, since the bit lines BL1-BLn are floating or a voltage approximately equal to zero is dropped across the access elements 18b, so the deselected row and column lines are at about the same voltage. Spare (redundant) rows and columns may be provided and used with a selection stage to replace bad rows, bits, and columns by techniques familiar to those skilled in the art.

During a reading or a writing operation, the word line selection circuits 110 lower (or raise if an MOS transistor select device is used) the voltage of a selected one of the word lines WL1-WLm to a word line selection voltage VWL (for example, having a value equal to 0V—the ground potential—if a bipolar diode or a chalcogenide select device, such as an ovonic threshold switch, is used), while the remaining word lines may be kept at the word line deselection voltage Vdes. Similarly, the bit line selection circuits 115 couple a selected one of the bit lines BL1-BLn (more typically, a selected bit line packet) to the read/write circuits 120, while the remaining, non-selected bit lines are left floating or held at the deselection voltage, Vdes. Typically, when the memory device 100 is accessed, the read/write circuits 120 force a suitable current pulse into each selected bit line BL1-BLn. The pulse amplitude depends on the reading or writing operations to be performed.

In particular, during a reading operation, a relatively low current pulse (compared to write current pulse magnitude) is applied to each selected bit line. The read current pulse has a suitable amplitude and a suitable time duration. The read current causes the charging of stray capacitances CBL1-CBLn (typically, of about 1 pF), intrinsically associated with the parasitic bit lines BL1-BLn and column drive circuitry, and, accordingly, a corresponding transient of a bit line voltage VBL at each selected bit line BL1-BLn. When the read current is forced into each selected bit line BL1-BLn, the respective bit line voltage raises towards a corresponding steady-state value, depending on the resistance of the storage element 18a, i.e., on the logic value stored in the selected memory cell MC. The duration of the transient also depends on the state of the storage element 18a. If the storage element 18a is in the crystalline or set state and the threshold device 18b is switched on, a cell current flowing through the selected memory cell MC when the column is forced to a voltage has an amplitude higher than the amplitude in the case where the storage element 18a is in the higher resistivity or reset state, and the resulting voltage on the column line when a constant current is forced is lower for a set state relative to reset state.

The logic value stored in the memory cell MC may be evaluated by means of a comparison of the bit line voltage (or another voltage related to the bit line voltage) at, or close to, the steady state thereof with a suitable reference voltage, for example, obtained exploiting a service reference memory cell in an intermediate state or its equivalent. The reference voltage can, for example, be chosen to be an intermediate value between the bit line voltage when a logic value "0" is stored and the bit line voltage when a logic value "1" is stored.

In order to avoid spurious reading of the memory cells MC or to properly terminate the write cycle, the bit line stray capacitances CBL1-CBLn may be discharged before performing a read operation. To this purpose, bit line discharge circuits 1251-125n are provided, associated with the bit lines BL1-BLn. The bit line discharge circuits 1251-125n may be enabled in a bit line discharge phase of the memory device operation, preceding and after any operation, for discharging the bit line stray capacitances CBL1-CBLn.

The bit line discharge circuits 1251-125n may be implemented by means of transistors, particularly N-channel MOSFETs having a drain terminal connected to the corresponding bit line BL1-BLn, a source terminal connected to a deselection voltage supply line Vdes providing the deselection voltage Vdes and a gate terminal controlled by a discharge enable signal DIS_EN. Before starting a writing or a reading operation, the discharge enable signal DIS_EN may be temporarily asserted to a sufficiently high positive voltage, so that all the discharge MOSFETs turn on and connect the bit lines BL1-BLn to the deselection voltage supply line Vdes. The discharge currents that flow through the discharge transistors cause the discharge of the bit line stray capacitances CBL1-CBLn for reaching the deselection voltage Vdes. Then, before selecting the desired word line WL1-WLm, the discharge enable signal DIS_EN is deasserted and the discharge MOSFETs turned off. Similarly, to minimize access delay, the selected row and column lines may be respectively precharged to an appropriate safe starting voltage for selection and read or write operation. For example, the row line may be precharged to zero volts while the column is forced to a voltage slightly less than minimum threshold voltage of a threshold device, such as an ovonic threshold switch.

The storage element 18a includes an insulator, a lower electrode, a phase change memory material, a top electrode, and a barrier film. The phase change material is a phase change material suitable for non-volatile memory data storage having electrical properties (e.g., resistance) that may be changed through the application of energy such as, for example, heat, light, voltage potential, or electrical current.

Examples of phase change materials include a chalcogenide material or an ovonic material. An ovonic material is a material that undergoes electronic or structural changes and acts as a semiconductor once subjected to application of a voltage potential, electrical current, light, heat, etc. A chalcogenide material is a material that includes at least one element from column VI of the periodic table or that includes one or more of the chalcogen elements, e.g., any of the elements of tellurium, sulfur, or selenium.

In one embodiment, the memory material is a chalcogenide element composition from the class of tellurium-germanium-antimony material or a GeSbTe alloy ($(Te_xGe_ySb_z$, such as x=2, y=2, z=5), although the scope of the present invention is not limited to just these materials.

Programming of the memory material to alter the state or phase of the material may be accomplished by applying a voltage potential difference of about 0.5 to 1.5 volts across a portion of the memory material by applying about 0 volts to a word line WL and about 0.5 to 1.5 volts to a bitline. A current flowing through the memory material in response to the applied voltage potentials may result in heating of the memory material. This heating and subsequent cooling may alter the memory state or phase of the material.

In a low voltage or low field regime, the threshold device 18b is off and may exhibit very high resistance in some embodiments. The off resistance can, for example, range from 100,000 ohms to greater than 10 gigaohms at a bias of half the threshold voltage, such as about 0.4V. The threshold device 18b remains in its off state until a threshold voltage VT or threshold current IT switches the device 18b to a highly conductive, low resistance selected on state. The voltage across the threshold device 18b after turn on drops to a slightly lower voltage relative to threshold, called holding voltage VH plus the current forced times the dynamic resistance of the "on" selection device. In one embodiment of the present invention, as an example, the threshold voltage is on the order of 1.1 volts and the holding voltage is on the order of 0.9 volts, and the dynamic resistance may be 500 ohms.

After passing through the snapback region, in the on state, the voltage drop on the threshold device 18b remains close to the holding voltage as the current passing through the device is increased up to a certain, relatively high, current level for writing or relatively low current for reading. Above that current level the threshold device 18b remains on but displays a finite differential resistance with the voltage drop increasing with increasing current. The threshold device 18b remains on until the current is dropped below a characteristic holding current value that is dependent on the size and the material utilized to form the threshold device 18b.

In some embodiments of the present invention, the selection device 18b does not change phase. It remains permanently amorphous and its current-voltage characteristics remains the same throughout its operating life.

As an example, for a 0.5 micrometer diameter threshold device 18b formed of TeAsGeSSe having respective atomic percents of 16/13/15/1/55, the holding current may be on the order of 0.1 to 100 micro-amps. Below this holding current, the threshold device 18b turns off and returns to the high resistance regime at low voltage, low field. The threshold current for the threshold device 18b may generally be of the same order as the holding current and preferably greater than the holding current to avoid oscillations depending on read bias point. The holding current may be altered by changing process variables, such as the electrode materials and the chalcogenide material. The threshold device 18b may allow a relatively high "on current" for a given area of device and voltage across it compared to conventional access devices such as metal oxide semiconductor field effect transistors or bipolar junction transistors or diodes.

As indicated above, one technique for addressing the array 105 uses a voltage V applied to the unselected column and rows, with zero voltage applied to the selected row. The voltage V is chosen to be greater than or equal to the minimum threshold voltage of the threshold device 18b, but less than two times this minimum threshold voltage. In other words, the maximum threshold voltage of the threshold device 18b, and the maximum holding voltage of threshold device 18b plus the maximum reset threshold voltage thereof may be less than 2V. All of the unselected rows and columns may be biased at V/2.

With this approach, there is no bias voltage between the unselected rows and unselected columns. This reduces and minimizes background and standby leakage current.

After biasing the array 105 in this manner, the storage elements 18a may be programmed and read by whatever means is needed for the particular memory technology involved, the dynamic resistances of the threshold device 18b and storage element 18a are low enough so that the memory may be written using less than 2V volts.

Programming a given selected bit in the array 105 can be as follows. Unselected rows and columns are biased as described for addressing, such as at Vdes. Zero volts is applied to the selected row. A current is forced on the selected column with a voltage compliance that is greater than the maximum threshold voltage of the threshold device 18b, and equal to the maximum holding voltage plus the maximum threshold voltage of the storage element 18a plus margin to allow writing. The current amplitude, duration, and pulse shape may be selected to place the storage element 18a in the desired phase and thus, the desired memory state. Preferably, the write pulse is terminated with a fast edge rate less than 10 nsec to write a reset bit and a slow edge rate greater than 200 nsec to write a set bit.

Reading a storage element 18a can be performed as follows. Unselected rows and columns are biased as described previously at Vdes. Zero volts is applied to the selected row. A voltage is forced at a value greater than the maximum threshold voltage of the threshold device 18b, but less than the minimum holding voltage of the threshold device 18b plus the minimum threshold voltage of the storage element 18a on the selected column. The current compliance of this forced voltage is less than the current that could program or disturb the set phase of the storage element 18a. If the storage element 18a is set, the access device 18b switches on and presents a low voltage, high current condition to a sense amplifier. If the storage element 18a is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

A control stage 32 is connected to the wordline and bitline selector circuits 110, 115. Control stage 32 may be a microcontroller or a microprocessor, including a processing unit 86 and a float buffer sequence storage 12. The control stage 32 also includes a data buffer 42 and a float buffer 44. The data buffer 42 temporarily stores new data the user wants to store on the core or array 105. The float buffer 44 indicates which data buffer bits are different than corresponding bits in a portion of the array 105. While the control stage 32 is shown as one element, it may be implemented as multiple elements. The data buffer 42 may be smaller than the size of the array 105. Thus, the data to be stored on the array 105 may be passed as discrete chunks to the data buffer 42. The data buffer 42 chunk then has a bit-by-bit correspondence to a portion of the array. The float buffer 44 may correspond one-to-one to the data buffer 42. Any memory location in the data buffer that is changed results in the corresponding locations in the float buffer changing (e.g., to zero).

Figure 2:
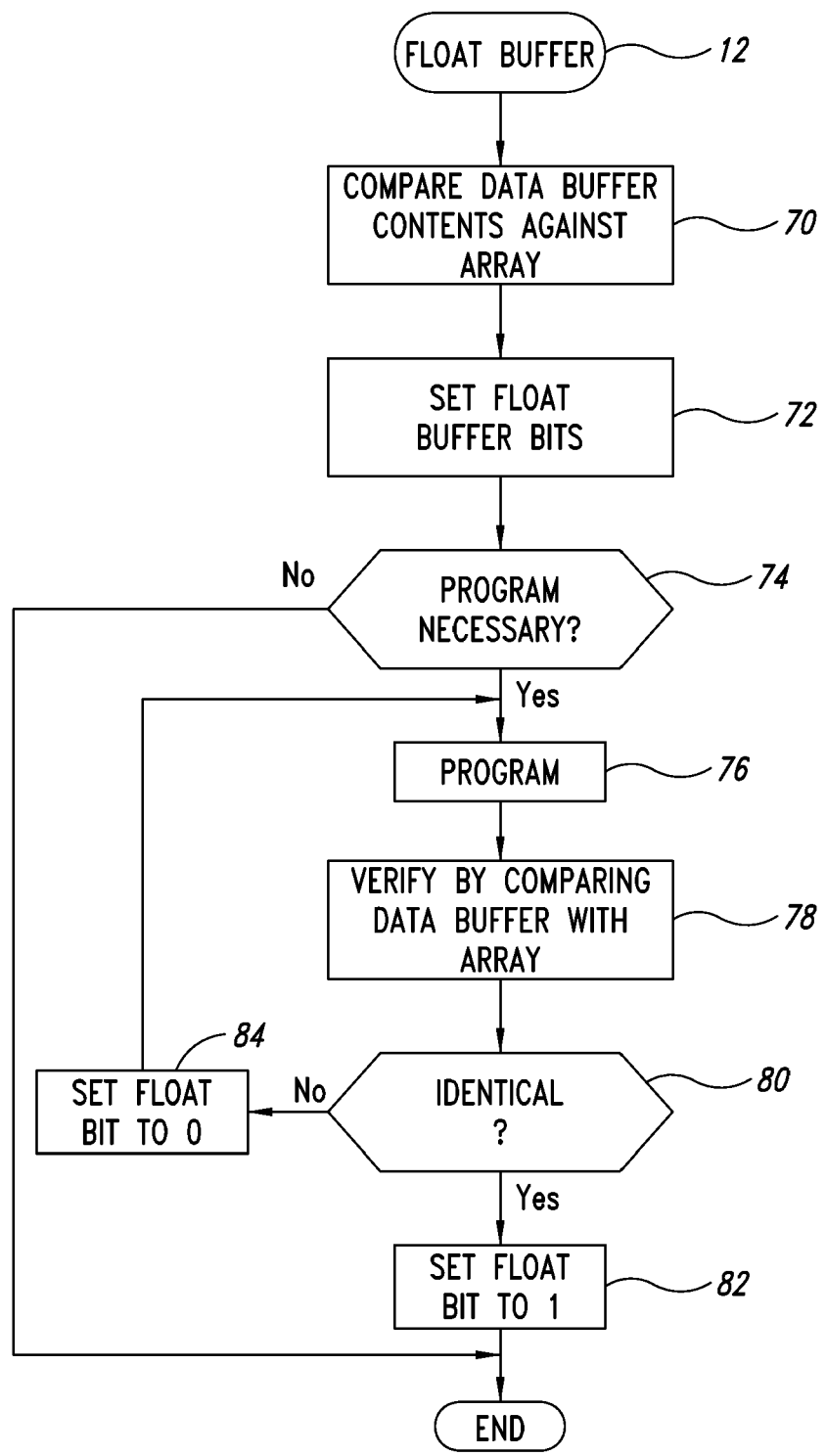
FIG. 2 is a flow chart of the operation of one embodiment.

FIG. 2 shows a sequence that may be implemented to perform a float buffer function. The sequence may be implemented in software, hardware, or firmware by the processing unit 86 or by one or more individual modules for each step. In FIG. 2, the float buffer sequence begins by comparing the contents of the data buffer 42 (containing a state to be programmed) against the contents of a corresponding portion of the array 105, as indicated in block 70. The bits in the float buffer 44 are then set, as indicated in block 72. The setting of the float buffer bits indicates whether the data in the array 105 portion to be programmed and the data in the data buffer 42 correspond. If the data at a given location of the data buffer 42 and the corresponding location in array 105 are the same, it would not be necessary to reprogram the array since the array location is already in the intended state. If there is a difference between the intended state (in the data buffer 42) and the existing memory state (in the array 105), a corresponding bit in float buffer 44 is set, e.g., to zero value. Of course, the zero and one convention could also be reversed. After the float buffer bits have been set, a check at block 74 determines which bits in the array need to be programmed. If no array bits need to be programmed, the flow ends.

Otherwise, only the appropriate bits in the array are programmed, as indicated in block 76. The programming of the array bits is then checked by comparing the data buffer 42 with the array 105, as indicated in block 78. If they are all identical, as determined in block 80, the float buffer bits are all set to one, as indicated in block 82. Otherwise, if there are any data buffer bits that are not identical to their corresponding array bits, only the necessary array bits are reprogrammed (block 84). Thereafter, the float buffer 44 is reset, block 82. By maintaining the state of the float buffer 44, the float buffer 44 can be used to determine which bits need to be verified.

Figure 3:
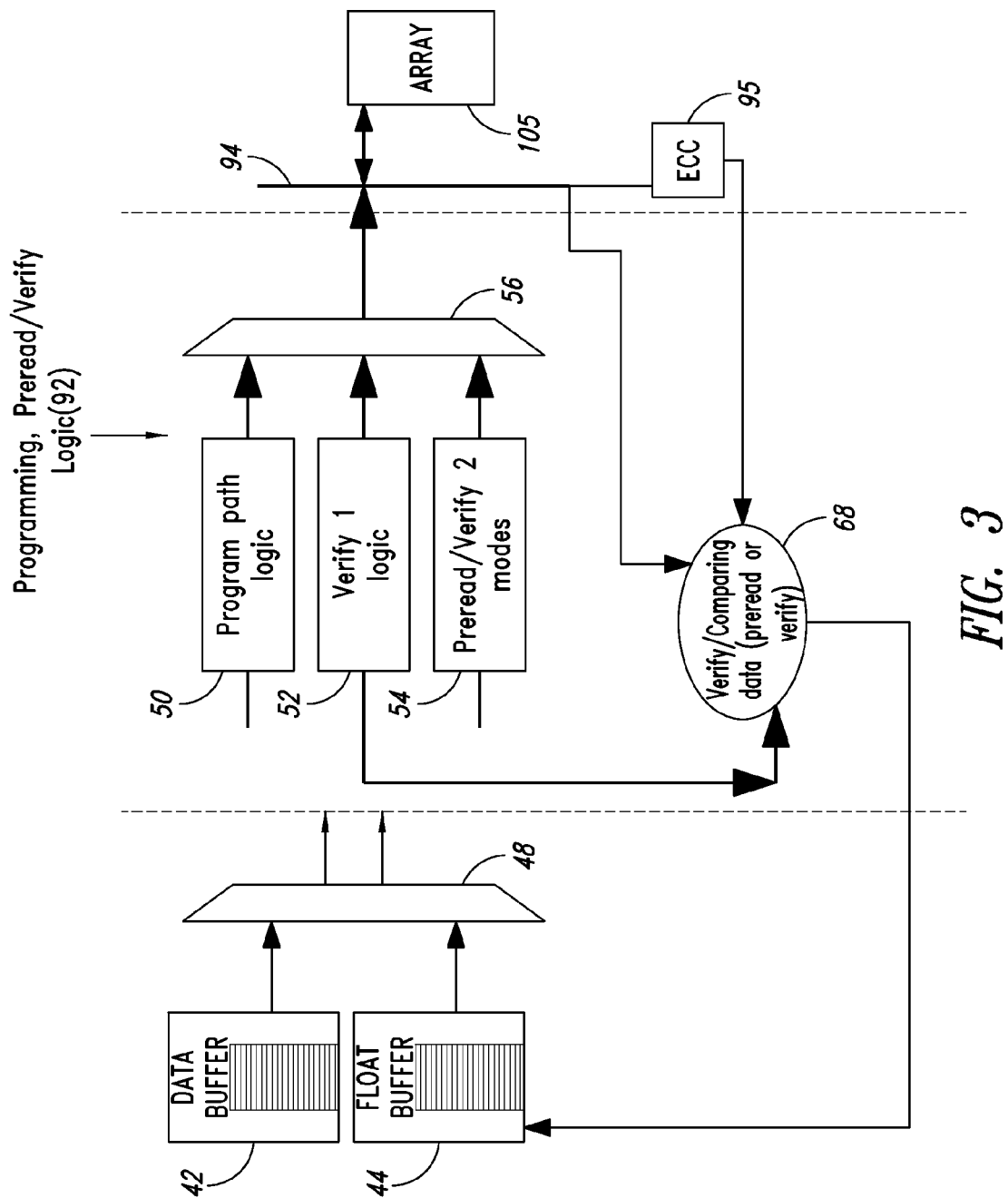
FIG. 3 is a schematic diagram for one embodiment.

In a hardware embodiment, illustrated in FIG. 3, the data buffer 42 and the float buffer 44 are coupled to the array 105 through a multiplexer 48 that receives a control signal from the processing unit 86 that controls which buffer (42 or 44) is read out.

The data from either of buffers 42 and 44 then go to a programming, pre-read, and verify logic section 92, e.g., belonging to the processing unit 86. Section 92 includes a program path logic block 50, a verifying block 52 and a pre-reading and verifying block 54. The program path logic block 50 is responsible for driving data from the data buffer 42 onto the array 105. The verifying block 52 controls a verification step to determine if the programming of the array 105 results in any error, and sends information to the array 105 about which locations are to be programmed. Pre-reading and verifying block 54 is responsible for pre-reading and verifying modes. The data from the blocks 50, 52, and 54 are input to another multiplexer 56 and selectively passed to the array 105 through a bus 94. The data in the data buffer 44 and the array 105 are compared in a comparator 68, formed, e.g., by exclusive NOR gates or other known comparators.

Programming includes a pre-read, wherein initially the content of the data buffer 42 is compared to the content of the array 105, with the result being fed back onto the float buffer 44. The pre-read mode is controlled by the pre-reading and verifying block 54, while the comparison is performed by the comparator 68.

Next, in a program mode, the content of the float buffer 44 is analyzed by the verifying block 52 to determine the need for programming and the data to be programmed are sent from the data buffer 42 to the array 105. Then, the array 105 is programmed. After programming, the programming operation is verified by comparing the content of the data buffer 42 with the content of the array 105 in the comparator 68. The float buffer 44 can be used to identify those bit locations that were programmed so that only the programmed bits are verified. If they match, a bit is fed back to the float buffer 44 with a one and, otherwise, fed back to the float buffer with a zero. In the event of even one zero being fed back, the programming stage has not completed and a repulse is required. Otherwise, an all-one float buffer 44 at the end of the verify operation completes the programming operation.

When the data is loaded into the data buffer 42, zero bits are generated and loaded into the float buffer 44. A pre-read operation compares the data buffer 42 and the array 105 and the outcome of the comparison is fed back from the comparator 68 to the float buffer 44. Next, in the programming mode, the array 105 only programs locations whose corresponding bit in the float buffer 44 is equal to zero, while skipping the programming of any locations whose bit in the float buffer 44 is one. Afterwards, a verify comparison between the data buffer 44 and the array 105 again results in feedback to the float buffer 42.

When a float buffer bit is set to one, either after the pre-read or the verify operation, it stays one. The next time when a comparison happens due to re-pulse, the float buffer bit is already a one and comparison between the data buffer 42 and the array 105 does not need to be done. In one embodiment, the comparison is carried out only if the float buffer bit corresponding to the location of the data bit is zero. Thus, if for whatever reason the array 105 changes its value after the completion of the first program pulse, it will not be reprogrammed again because the float buffer 44 bit is already set to one.

Thus, unnecessary programming of bits may be eliminated or at least reduced. This results in power consumption reduction and in increase of the cycle life of the array.

An error correction code system may be utilized to correct any words that have errors. The refresh algorithm attempts to reprogram failed bits by applying a current pulse to those bits being corrected pursuant to an error correction code. In one embodiment, it may be implemented in microcode assembly language. In other embodiments, it may be implemented in software. The error correction 95 may be part of the control stage 32. However, it may also be implemented in hardware or software.

During a program operation, new error correcting code bits based on the existing data pattern are generated. The error correcting block 95 outputs a signal that goes high when an error correcting code was used to correct an error. During a normal pre-read, this signal is monitored to keep track of whether there was an error in a code word. Then, a normal program algorithm follows. After successful completion, if error correction was used during the pre-read, then the refresh algorithm is implemented.

In the refresh algorithm, a read at the same location is performed and the corrected output of the error correction is saved to the data buffer 42. Then a compare is done between the corrected data in the data buffer 42 against the raw array data stored in the array 105. The result from this comparison is used to determine which bits out of the code word will get the program pulse.

Figure 4:
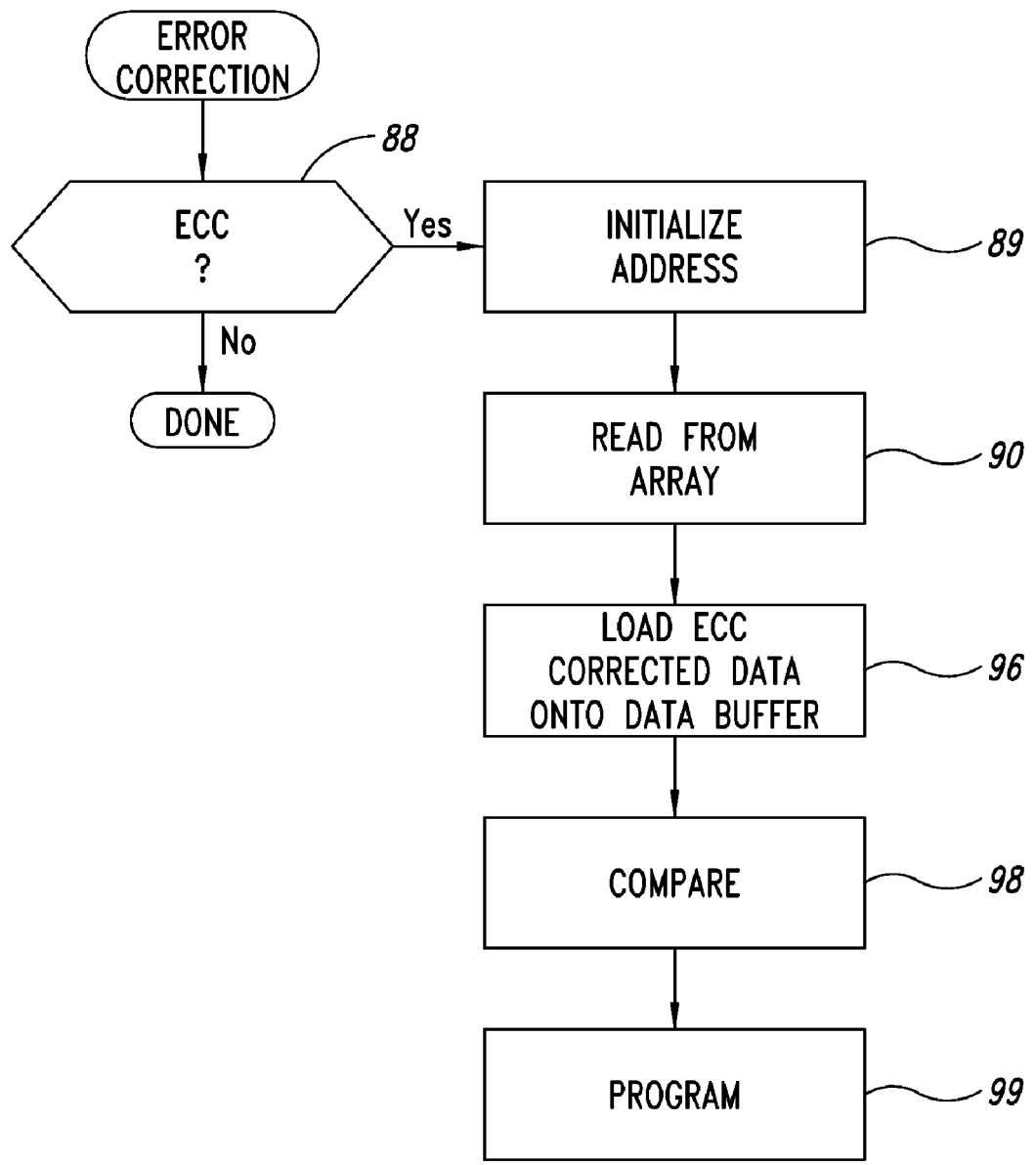
FIG. 4 is a flow chart for another embodiment.

Thus, referring to FIG. 4, if error correction code was utilized, as determined in block 88, an address is initialized, block 89. The address that is initialized is the address of the corrected data. Then, block 90, the corresponding data at the address is read from the array 105.

Next, as indicated in block 96, the error corrected data is loaded onto the data buffer 42. The uncorrected data is then compared against the data on the data buffer 42 and the float bits are updated, as indicated in block 98. Then, in block 99, a program pulse is applied to the appropriate code word using the float bits to determine which words get programmed.

Figure 5:
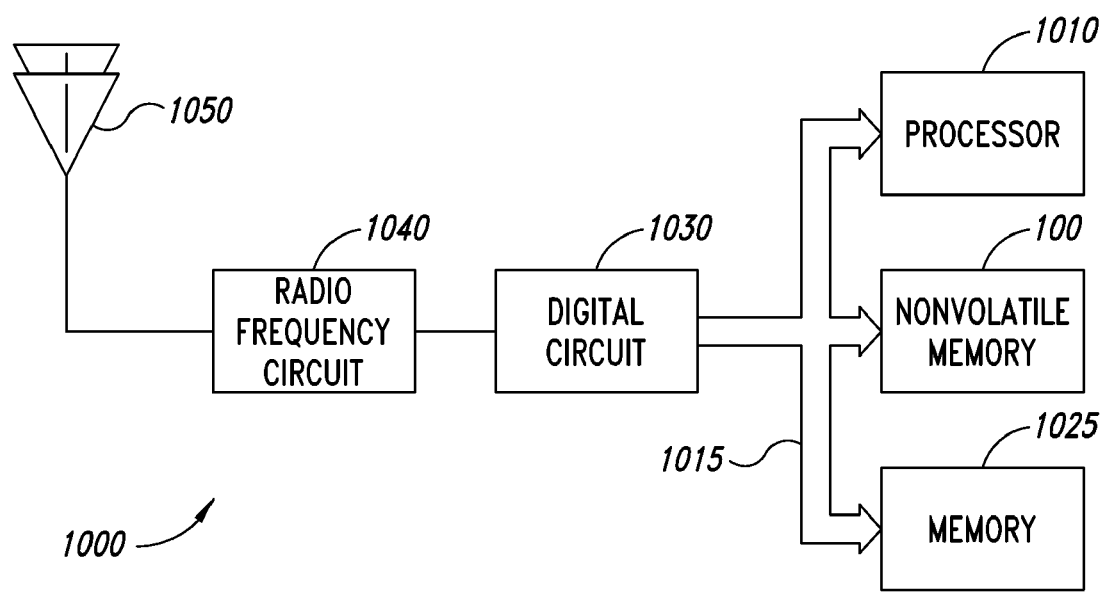
FIG. 5 is a system diagram for one embodiment.

FIG. 5 shows an electronic system 1000 incorporating the memory 100 of FIG. 1. Electronic system 1000 also includes a processor 1010, memory 1025, digital circuit 1030, radio frequency (RF) circuit 1040, and antennas 1050. Processor 1010 may be any type of processor configured to access non-volatile memory 100 and memory 1025. For example, processor 1010 may be a microprocessor, a digital signal processor, a microcontroller, or the like.

Example systems represented by FIG. 5 include cellular phones, personal digital assistant, wireless local area network interfaces, or any other suitable system. Non-volatile memory 100 may be configured to hold information for system 1000. For example, non-volatile memory 100 may hold device configuration data, such as contact information with phone numbers, or settings for digital circuit 1030 or RF circuit 1040. Further, non-volatile memory 100 may hold multimedia files such as photographs or music files. Still further, non-volatile memory 100 may hold program code to be executed by processor 1010.

Radio frequency circuit 1040 communicates with antennas 1050 and digital circuit 1030. In some embodiments, RF circuit 1040 includes a physical interface (PHY) corresponding to a communications protocol. For example, RF circuit 1040 may include modulators, demodulators, mixers, frequency synthesizers, low noise amplifiers, power amplifiers, and the like. In some embodiments, RF circuit 1040 includes a heterodyne receiver and, in other embodiments, RF circuit 1040 includes a direct conversion receiver. RF circuit 1040 may include multiple receivers. For example, in embodiments with multiple antennas 1050, each antenna may be coupled to a corresponding receiver. In operation, RF circuit 1040 receives communications signals from antennas 1050, and provides signals to digital circuit 1030. Further, digital circuit 1030 may provide signals to RF circuit 1040, which operates on the signals and then transmits them to antennas 1050.

Digital circuit 1030 is coupled to communicate with processor 1010 and RF circuit 1040. Digital circuit 1030 may include circuitry to perform error detection/correction, interleaving, coding/decoding, or the like. Also, digital circuit 1030 may implement all or a portion of a media access control (MAC) layer of a communications protocol. A MAC layer implementation may be distributed between processor 1010 and digital circuit 1030.

Radio frequency circuit 1040 is configured to receive and demodulate signals of various formats and at various frequencies. For example, RF circuit 1040 may be configured to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals.

Antennas 1050 includes one or more antennas. For example, antennas 1050 may include a single directional antenna or an omni-directional antenna. As used herein, the term omni-directional antenna refers to any antenna having a substantially uniform pattern in at least one plane. For example, antennas 1050 may include a single omni-directional antenna such as a dipole antenna or a quarter wave antenna. Also, for example, antennas 1050 may include a single directional antenna such as a parabolic dish antenna or a Yagi antenna. In still further embodiments, antennas 1050 may include multiple physical antennas. For example, in some embodiments, multiple antennas are utilized to support multiple-input-multiple-output (MIMO) processing or spatial-divisional multiple access (SDMA) processing.

Memory 1025 represents an article that includes a machine readable medium. For example, memory 1025 represents a random access memory (RAM), dynamic random access memory (DRAM), static random access memory (SRAM), read only memory (ROM), flash memory, or any other type of article that includes a medium readable by processor 1010. Memory 1025 may store instructions for performing the execution of the various method embodiments of the present disclosure.

In operation, processor 1010 reads instructions and data from either or both of non-volatile memory 100 and memory 1025 and performs actions in response thereto. For example, processor 1010 may access instructions from memory 1025 and program threshold voltages within reference voltage generators and reference current generators inside non-volatile memory 100. In some embodiments, non-volatile memory 100 and memory 1025 are combined into a single memory device. For example, non-volatile memory 100 and memory 1025 may both be included in a single non-volatile memory device.

Although the various elements of system 1000 are shown separate in FIG. 3, the circuitry of processor 1010, non-volatile memory 100, memory 1025, and digital circuit 1030 in a single integrated circuit may be combined. For example, memory 1025 or non-volatile memory 100 may be an internal memory within processor 1010 or may be a microprogram control store within processor 1010. The various elements of system 1000 may be separately packaged and mounted on a common circuit board or the various elements are separate integrated circuit dice packaged together, such as in a multi-chip module, or various elements on the same integrated circuit die.

The type of interconnection between processor 1010 and non-volatile memory 100 is not a limitation of the present invention. For example, bus 1015 may be a serial interface, a test interface, a parallel interface, or any other type of interface capable of transferring command and status information between processor 1010, non-volatile memory 100, and memory 1025.

Step voltage generators, voltage references, flash cells, and other components of the present memory can be implemented in many ways. For example, they can be implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, embodiments of the present invention can also be represented as a hard macro targeted to a specific manufacturing process. For example, memory array (FIG. 1) can be represented as polygons assigned to layers of an integrated circuit.

Finally, it is clear that numerous variations and modifications may be made to the contact region, the phase change memory cell and process described and illustrated herein.

For example, non-volatile memory 100 may be used in a desktop computer, a network bridge or router, or any other system without an antenna.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   determining whether a memory cell in a phase change memory array needs programming by comparing a state of data stored in the memory cell with a desired state;
   storing in a storage element a result of the comparing between the state of the data stored in said memory cell and the desired state;
   storing a datum in a data buffer; and
   comparing a state of the datum in the data buffer to the state of data stored in the memory cell and changing the datum in the storage element depending on said comparing of the state of the datum in the data buffer to the state of data stored in the memory cell.

2. The method of claim 1, including avoiding reprogramming said cell if the cell is already in the first state and only programming the cell if the cell is not in the desired state.

3. The method of claim 1, wherein the data buffer and the storage element have a same number of corresponding locations and the data buffer has a bit-by-bit correspondence to at least a portion of the array, the step of changing including storing in each location of the storage element a datum representing a result of the comparing of the datum in the corresponding location of the data buffer and a datum in a corresponding memory cell of the array.

4. The method of claim 3, comprising, after the step of changing, programming only the cells in the array that are associated with locations in the storage element indicating a difference in the result of the comparing of the data in the data buffer to the data in the corresponding memory cells, changing the data in the storage element depending on said comparison, and checking the storage element to determine whether all of the storage element locations indicate equal data.

5. The method of claim 3, comprising initially loading the locations of the storage element with a state indicating a need of programming, wherein changing comprises changing the state of one of the locations of the storage element when the comparing indicates equal data in the corresponding location of the data buffer and the corresponding cell in the array.

6. The method of claim 3, wherein changing comprises changing the states of the locations of storage element when the comparing indicate different data in the corresponding locations of the data buffer and corresponding cells in the array.

7. A phase change memory comprising:
   an array of phase change memory cells;
   a comparator configured to compare a state of a datum stored in a selected one of the memory cells and a desired state, and output a result;
   a storage element configured to store the result output by the comparator; and
   control means for programming the selected cell, including:
      means for storing data in the data buffer,
      means for comparing states of the data in the data buffer to states in the memory cells, and
      means for changing data in the storage element depending on said comparison of the states of the data in the data buffer to the states in the memory cells to indicate the memory cells that need programming.

8. The memory of claim 7, including a data buffer configured to store the desired state.

9. The memory of claim 8, wherein the comparator is configured to compare the desired state as stored in the data buffer to the state of the datum stored in the selected memory cell and to store said result in said storage element.

10. The memory of claim 7, wherein the control means include means for programming the selected cell only if the selected cell is not already in the desired state as indicated by said storage element.

11. The memory of claim 7, wherein said control means further comprise means for checking the states of the memory cells after said programming, means for storing in said storage element whether any of said memory cells is not in the correct programmed state, and means for only programming those memory cells for which the storage element indicates that they are not in the correct programmed state.

12. The memory of claim 10, wherein said control means further comprise means for checking the storage element to determine whether all of the storage element locations indicate equal data.

13. A computer readable storage medium storing instructions that, when executed, cause a phase change memory to operate according to a method comprising:
   determining whether a memory cell in the phase change memory needs programming by comparing a state of data stored in the memory cell with a desired state;
   storing in a storage element storing a result of the comparing between the state of the data stored in said memory cell and the desired state;
   storing a datum in a data buffer; and
   comparing a state of the datum in the data buffer to the state in the memory cell and changing the datum in the storage element depending on said comparing of the state of the datum in the data buffer to a state in the memory cell.

14. The computer readable storage medium of claim 13, wherein the data buffer and the storage element have a same number of corresponding locations and the data buffer has a bit-by-bit correspondence to at least a portion of the memory, the changing including storing in each location of the storage element a datum representing a result of the comparing of the datum in the corresponding location of the data buffer and a datum in a corresponding memory cell of the memory.

15. The computer readable storage medium of claim 14, wherein the method includes, after the step of changing, programming only the cells in the array that are associated with locations in the storage element indicating a difference in the result of the comparing of the data in the data buffer to the data in the corresponding memory cells, changing the data in the storage element depending on said comparison, and checking the storage element to determine whether all of the storage element locations indicate equal data.

16. A system comprising:
   a processor; and
   a phase change memory coupled to the processor and including:
      an array of phase change memory cells;
      a comparator configured to compare a state of a datum stored in a selected one of the memory cells and a desired state, and output a result;
      a storage element configured to store the result output by the comparator; and
      a control means for programming the selected cell, including:
         a means for storing data in the data buffer,
         a means for comparing states of the data in the data buffer to states in the memory cells, and
         a means for changing data in the storage element depending on said comparison of the states of the data in the data buffer to the states in the memory cells to indicate the memory cells that need programming.

17. The system of claim 16, wherein the memory includes:
a data buffer configured to store the desired state, wherein the comparator is configured to compare the desired state as stored in the data buffer to the state of the datum stored in the selected memory cell and to store said result in said storage element.

18. The system of claim 16, wherein the control means include means for programming the selected cell only if the selected cell is not already in the desired state as indicated by said storage element.

19. A phase change memory comprising:
an array of phase change memory cells;
a data buffer having bits corresponding to bits in a portion of the array, the data buffer bits being configured to store data to be programmed into the array;
a comparator configured to compare the bits in the data buffer to the corresponding bits in the portion of the array and to output data that indicate which data buffer bits differ from the corresponding bits in the portion of the array;
a storage element configured to store the data that indicate which data buffer bits differ from the corresponding bits in the portion of the array; and
a controller configured to program the array based upon the data stored in the storage element.

20. The phase change memory of claim 19 wherein storage element bits corresponds one-to-one with the data buffer bits.

21. The phase change memory of claim 19 wherein the storage element is configured to change as a result of a change to any one of the data buffer bits.

* * * * *